US011855173B2

(12) United States Patent
John et al.

(10) Patent No.: US 11,855,173 B2
(45) Date of Patent: Dec. 26, 2023

(54) TRANSISTOR WITH MONOCRYSTALLINE BASE STRUCTURES

(71) Applicant: NXP USA, INC., Austin, TX (US)

(72) Inventors: Jay Paul John, Chandler, AZ (US); Ljubo Radic, Gilbert, AZ (US); James Albert Kirchgessner, Tempe, AZ (US); Johannes Josephus Theodorus Marinus Donkers, Valkenswaard (NL)

(73) Assignee: NXP USA, INC., Austin, TX (US)

( * ) Notice: Subject to any disclaimer, the term of this patent is extended or adjusted under 35 U.S.C. 154(b) by 120 days.

(21) Appl. No.: 17/644,354

(22) Filed: Dec. 15, 2021

(65) Prior Publication Data

US 2023/0187527 A1    Jun. 15, 2023

(51) Int. Cl.
*H01L 29/66* (2006.01)
*H01L 29/165* (2006.01)
*H01L 29/737* (2006.01)

(52) U.S. Cl.
CPC ...... *H01L 29/66242* (2013.01); *H01L 29/165* (2013.01); *H01L 29/737* (2013.01)

(58) Field of Classification Search
CPC ............. H01L 29/66242; H01L 29/165; H01L 29/737
See application file for complete search history.

(56) References Cited

U.S. PATENT DOCUMENTS

| | | | |
|---|---|---|---|
| 7,442,616 B2 | 10/2008 | John et al. | |
| 8,431,966 B2 | 4/2013 | Meunier-Beillard et al. | |
| 8,476,675 B2 | 7/2013 | Meunier-Beiilard et al. | |
| 8,786,051 B2 | 7/2014 | Adkisson et al. | |
| 2011/0304019 A1* | 12/2011 | Meunier-Beillard | H01L 29/7378 257/E29.174 |
| 2013/0214275 A1* | 8/2013 | Adkisson | H01L 29/732 438/318 |
| 2015/0140771 A1 | 5/2015 | Fox et al. | |

OTHER PUBLICATIONS

Choi, L.J., "A Novel Isolation Scheme featuring Cavities in the Collector for a High-Speed 0. 13um SiGe:C BiCMOS Technology", 2007 Topical Meeting on Silicon Monolithic Integrated Circuits in RF Systems, Jan. 2007.
Fox, A., "SiGe:C HBT Architecture with Epitaxial External Base", 2011 IEEE Bipolar / BiCMOS Circuites and Technology Meeting, Oct. 9-11, 2011.

* cited by examiner

*Primary Examiner* — Syed I Gheyas
(74) *Attorney, Agent, or Firm* — David G. Dolezal

(57) ABSTRACT

A semiconductor die includes a transistor with an emitter, base, and collector. The base includes an intrinsic base that is located in monocrystalline semiconductor material grown in an opening of a first semiconductor layer. A second semiconductor layer is located above the first semiconductor layer and includes a monocrystalline portion. In some embodiments, an opening was formed in the second semiconductor layer wherein a portion of the underlying first semiconductor layer was etched to form a cavity in which a monocrystalline intrinsic base was grown.

20 Claims, 12 Drawing Sheets

TRANSISTOR WITH MONOCRYSTALLINE BASE STRUCTURES

BACKGROUND OF THE INVENTION

Field of the Invention

This invention relates in general to transistors with base structures.

Description of the Related Art

Some transistors such as bipolar transistors include a base as one of the transistor electrodes. Some types of bipolar transistors, such as heterojunction bipolar transistors (HBTs) can be used for high speed switching applications. HBTs typically implement different semiconductor material types for the emitter and base regions, creating a heterojunction. Some HBTs can handle signals of very high frequencies, up to several hundred GHz. HBTs can be used in radio-frequency (RF) systems and in applications requiring high power efficiency, such as in RF power amplifiers for cellular phones.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of at least one mode for carrying out the invention. The description is intended to be illustrative of the invention and should not be taken to be limiting.

As disclosed herein, a semiconductor die includes a transistor with an emitter, base, and collector. The base includes an intrinsic base that is located in monocrystalline semiconductor material grown in an opening of a first semiconductor layer. A second semiconductor layer is located above the first semiconductor layer and includes a monocrystalline portion. In some embodiments, an opening was formed in the second semiconductor layer wherein a portion of the underlying first semiconductor layer was etched to form a cavity in which a monocrystalline intrinsic base was grown.

Figure 1:
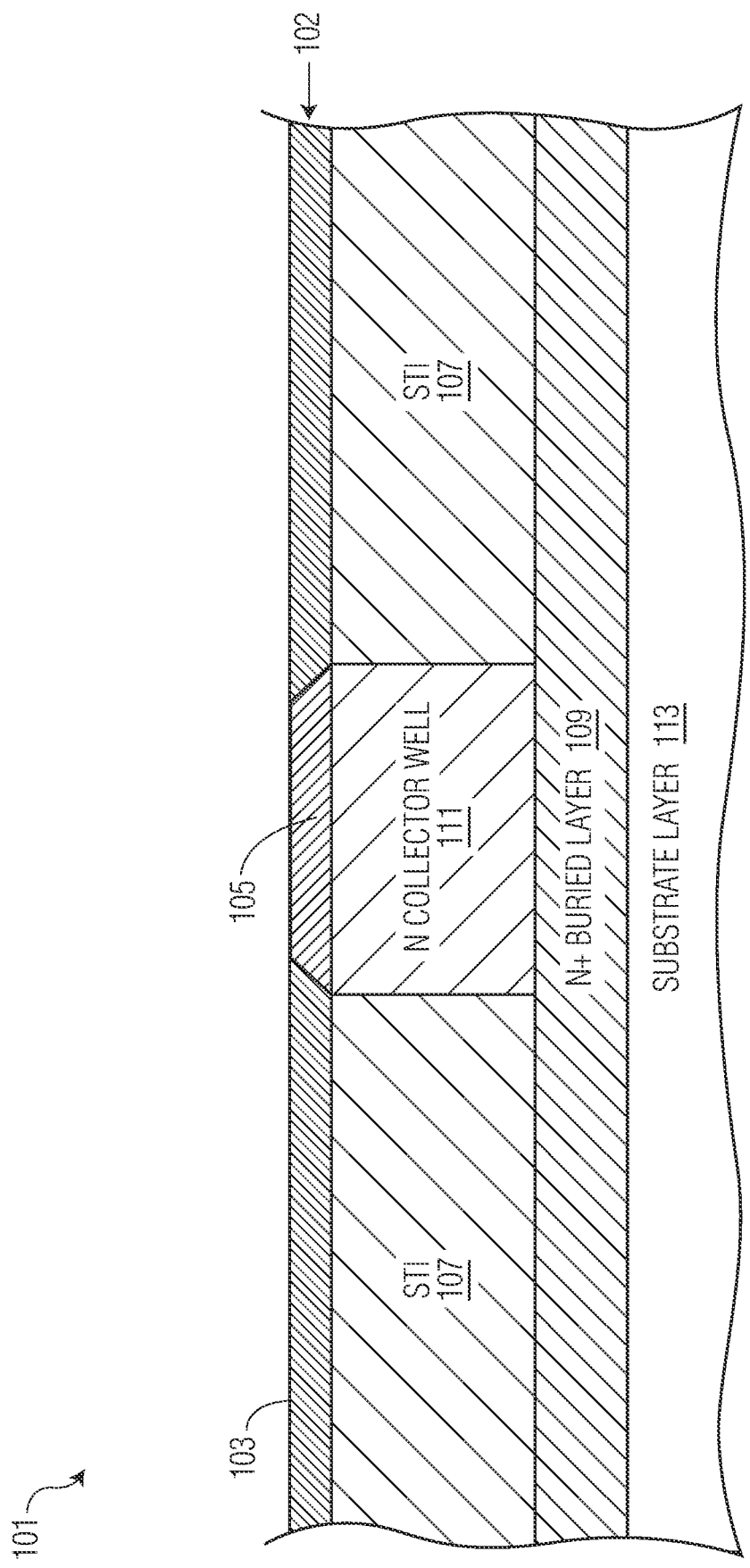
FIGS. 1-11 are partial cutaway side views of a wafer during various stages in the manufacture of a semiconductor device according to one embodiment of the present invention.

FIG. 1 is a partial cutaway side view of a wafer according to one embodiment of the present invention. Wafer 101 includes a substrate layer 113 of monocrystalline silicon. A buried layer 109 is doped with N type conductivity dopants (e.g., arsenic, phosphorous) and is located over layer 113. A collector well 111 is located over layer 109. Well 111 is laterally located between portions of a shallow trench isolation structure (STI) 107. In one embodiment, STI 107 laterally surrounds well 111. Well 111 is doped with N type conductivity dopants but at a lower concentration than layer 109.

A semiconductor layer 102 is located on STI 107 and collector well 111. In one embodiment, layer 102 is made of silicon germanium. In one embodiment, layer 102 serves as a seed layer for the formation of a subsequent semiconductor layer. In one embodiment, after a cleaning operation with HF acid and a pre-bake in a hydrogen atmosphere, layer 102 is formed by a non selective epitaxial growth process such that a portion 105 of layer 102 formed over mono crystalline silicon well 111 has a monocrystalline structure with an initial lattice constant generally matching that of well 111. A second portion 103 formed over the oxide of STI 107 has a polycrystalline structure.

Figure 2:
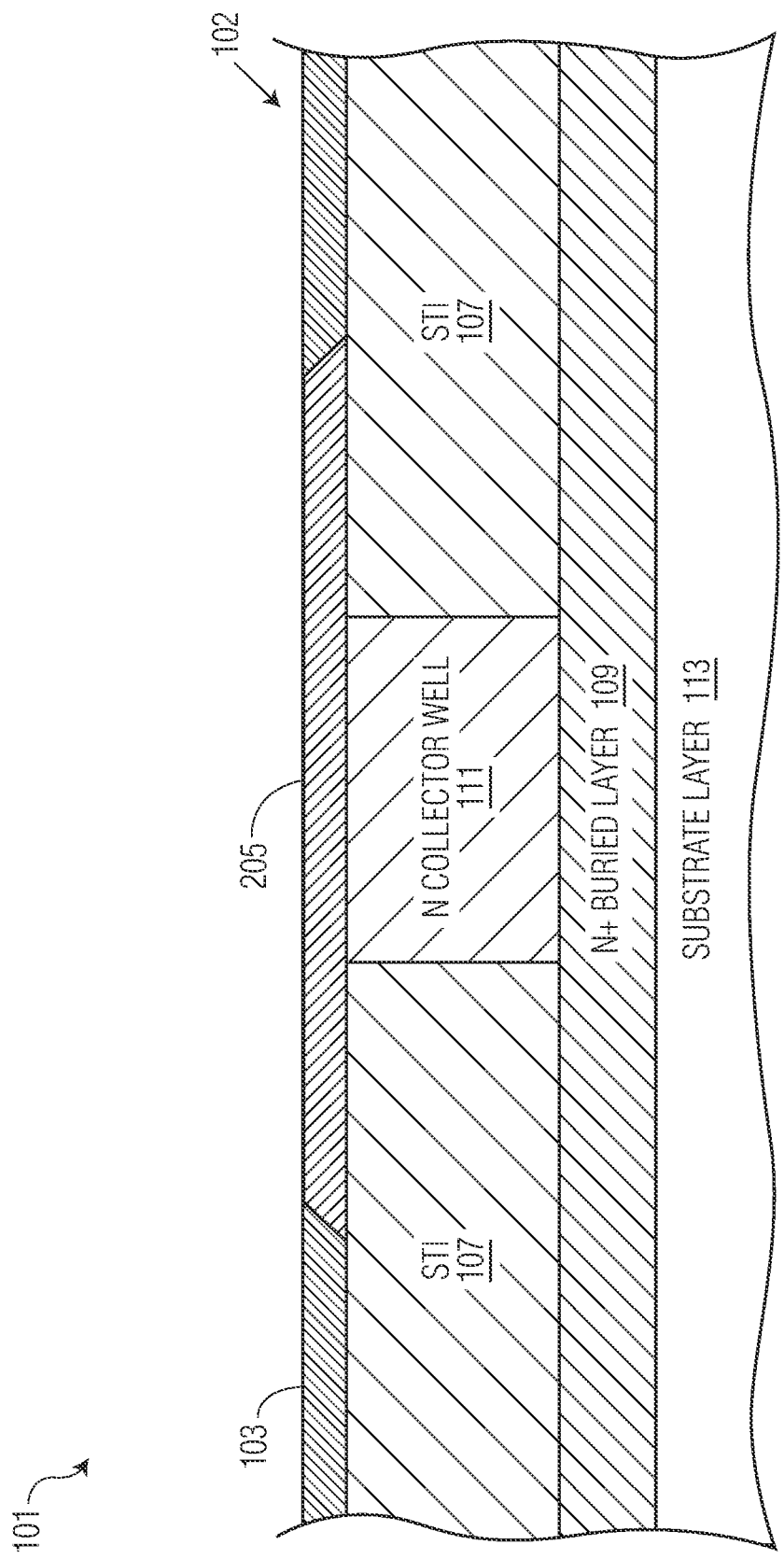

FIG. 2 is a partial cutaway side view of wafer 101 after the monocrystalline portion (labeled portion 105 in FIG. 1) of layer 102 has increased in size (shown as portion 205 in FIG. 2) to extend further out over STI 107. In one embodiment, the size of the monocrystalline portion 205 is increased by a blanket amorphizing implant into layer 102. In one embodiment, germanium dopants are implanted into layer 102 at a dosage of $10^{15}$ and at an energy of 20 KeV. However, other implantation operations may be performed at other dosages, other energies, and/or with other types of dopants (e.g., silicon, xenon). After implantation, a solid-phase epitaxial re-growth process is performed on layer 102. In one embodiment of a re-growth process, wafer 101 is heated for one minute for 700 C. Other types of re-growth processes may be performed in other embodiments such as wafer 101 being heated for 15 minutes at 600 C. In some embodiments, monocrystalline portion 105 can be expanded by performing a laser melt annealing process on wafer 101 in selected areas. In still other embodiments, the portion of layer 102 over well 111 may be masked for a selective amorphizing implant so as to avoid implant damage to the masked portions of layer 102 and N collector well 111.

Figure 3:
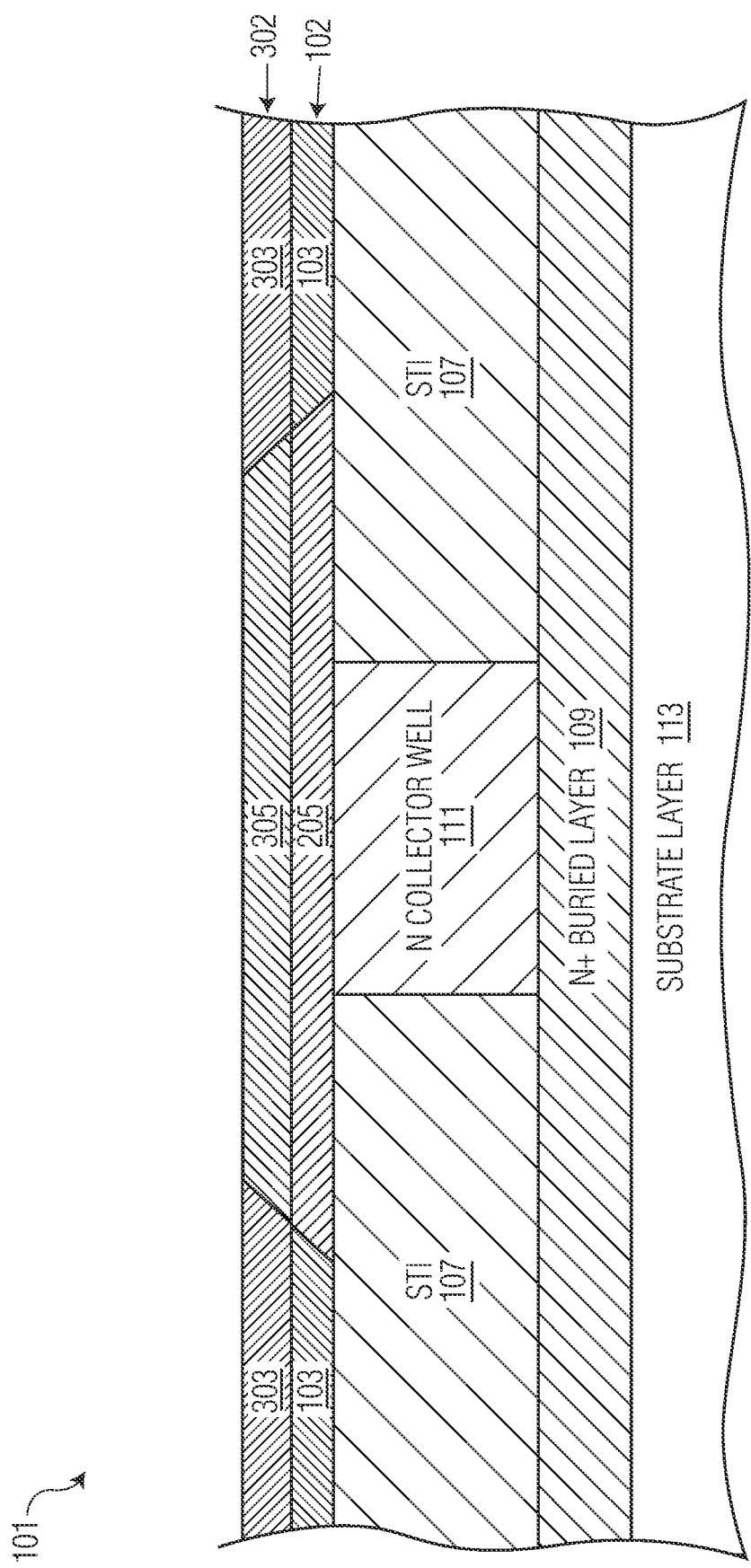

FIG. 3 is a partial side view of wafer 101 after semiconductor layer 302 is formed over layer 102. In one embodiment, after an HF cleaning process and a hydrogen pre bake of wafer 101 are performed, layer 302 is formed by a non selective epitaxial growth process. As a result of the epitaxial growth process, portion 305 of layer 302 is monocrystalline with a lattice constant initially matching that of the top portion of portion 205 of layer 102. Because portion 303 is grown on polycrystalline portion 103 of layer 102, portion 303 has a polycrystalline structure. In one embodiment, layer 302 is a silicon layer that is doped in-situ with a P type conductivity dopants (e.g., Boron), but may be doped after deposition by an ion implantation process in other embodiments.

Figure 4:
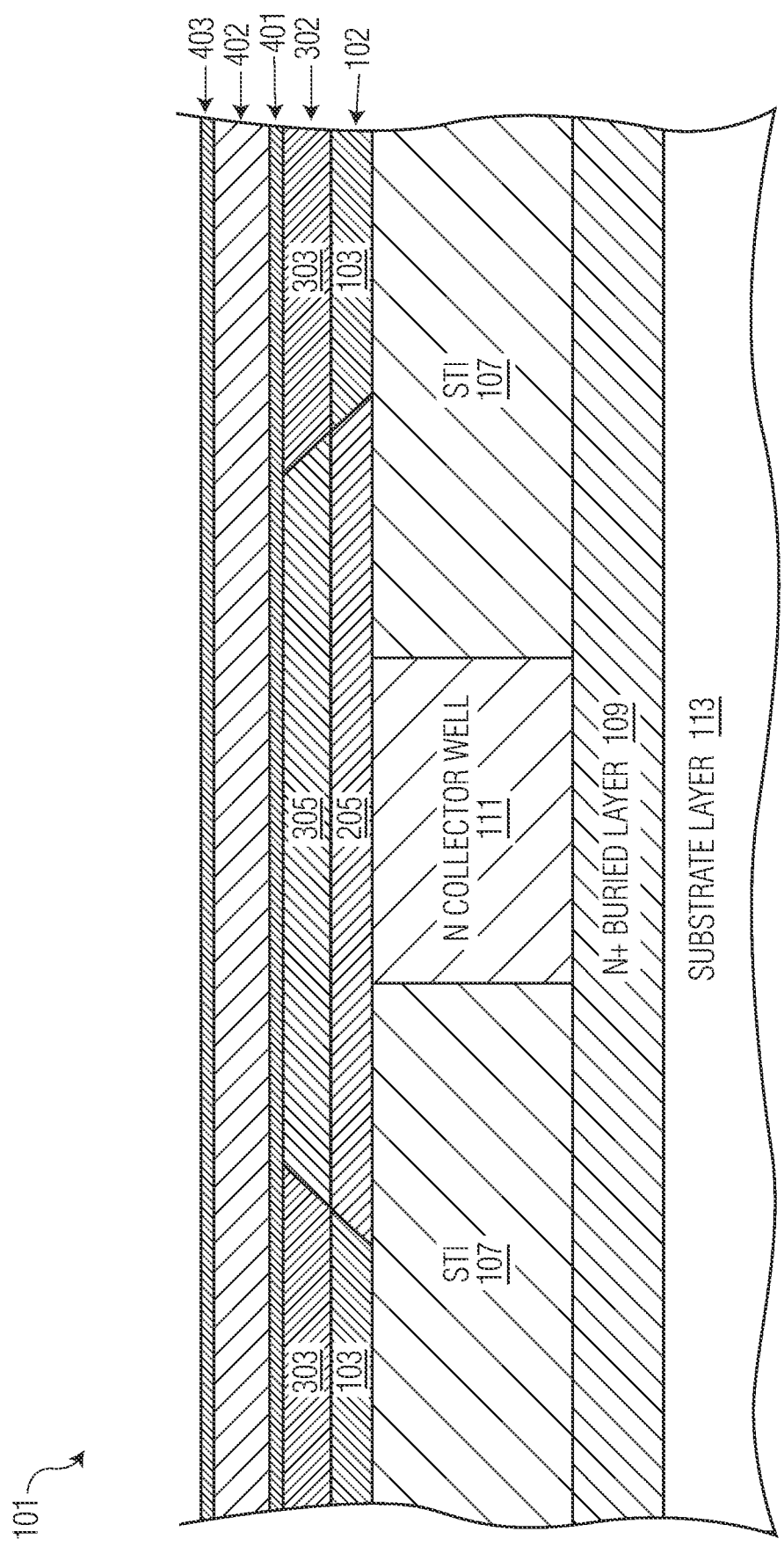

FIG. 4 is a partial side view of wafer 101 after oxide layer 401, nitride layer 402, and oxide layer 403 are formed on wafer 101. In some embodiments, these layers are formed by a low pressure chemical vaper deposition (LPCVD) process or a plasma enhanced chemical vapor deposition (PECVD) process.

Figure 5:
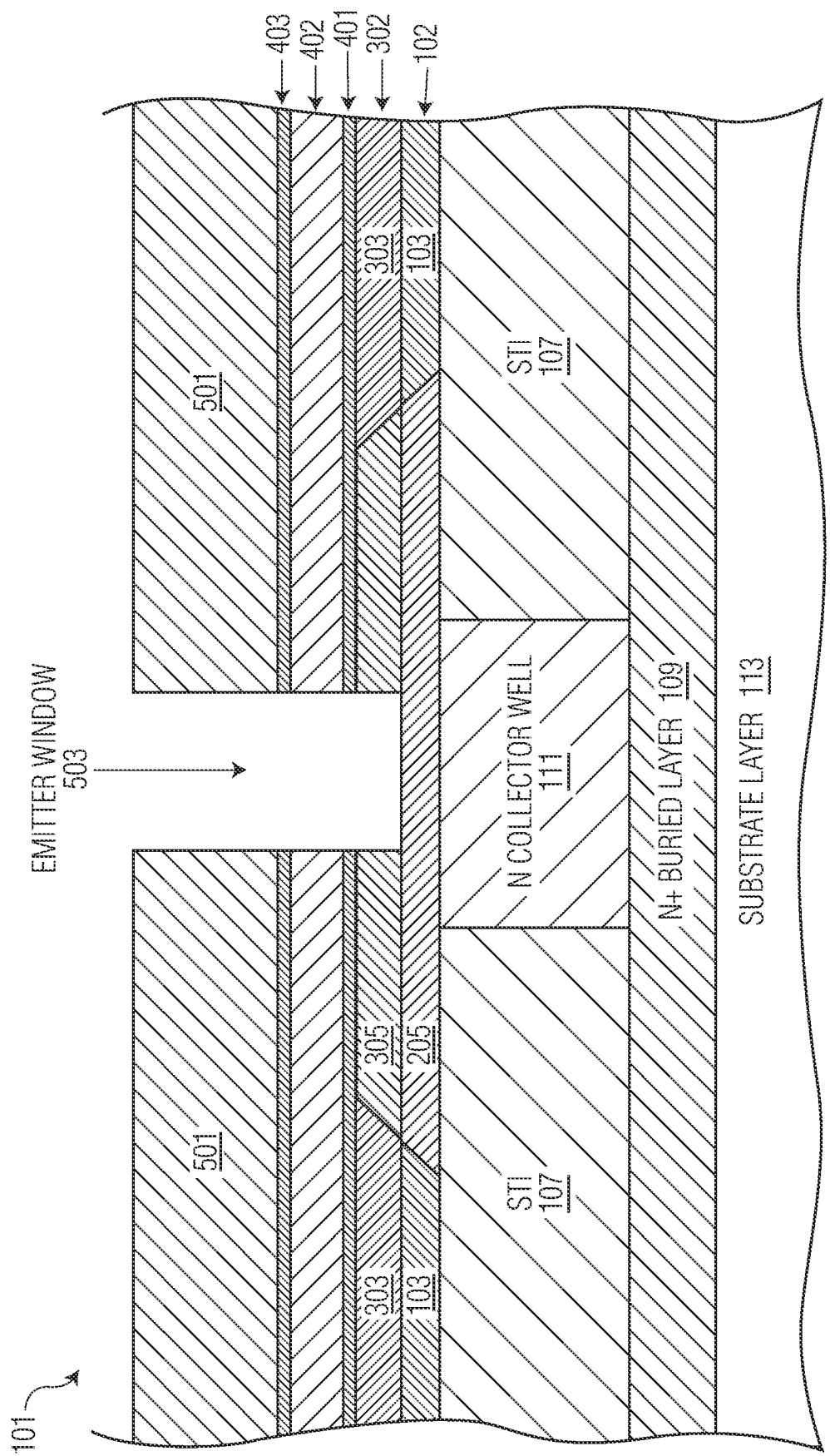

FIG. 5 is a partial cutaway side view of wafer 101 after a photoresist mask 501 is formed on oxide layer 403 and an emitter widow opening 503 is formed in mask 501, layers 403, 402, and 401, and in portion 305 of layer 302 to expose monocrystalline portion 205 of layer 102. In one embodiment, opening 503 is formed by a timed reactive ion etch (RIE) to remove the material of these layers to form opening 503. However, opening 503 may be formed by other ways in other embodiments. In the embodiment shown, opening 503 is formed in an area of wafer 101 that is located between STI 107 portions shown in FIG. 5.

Figure 6:
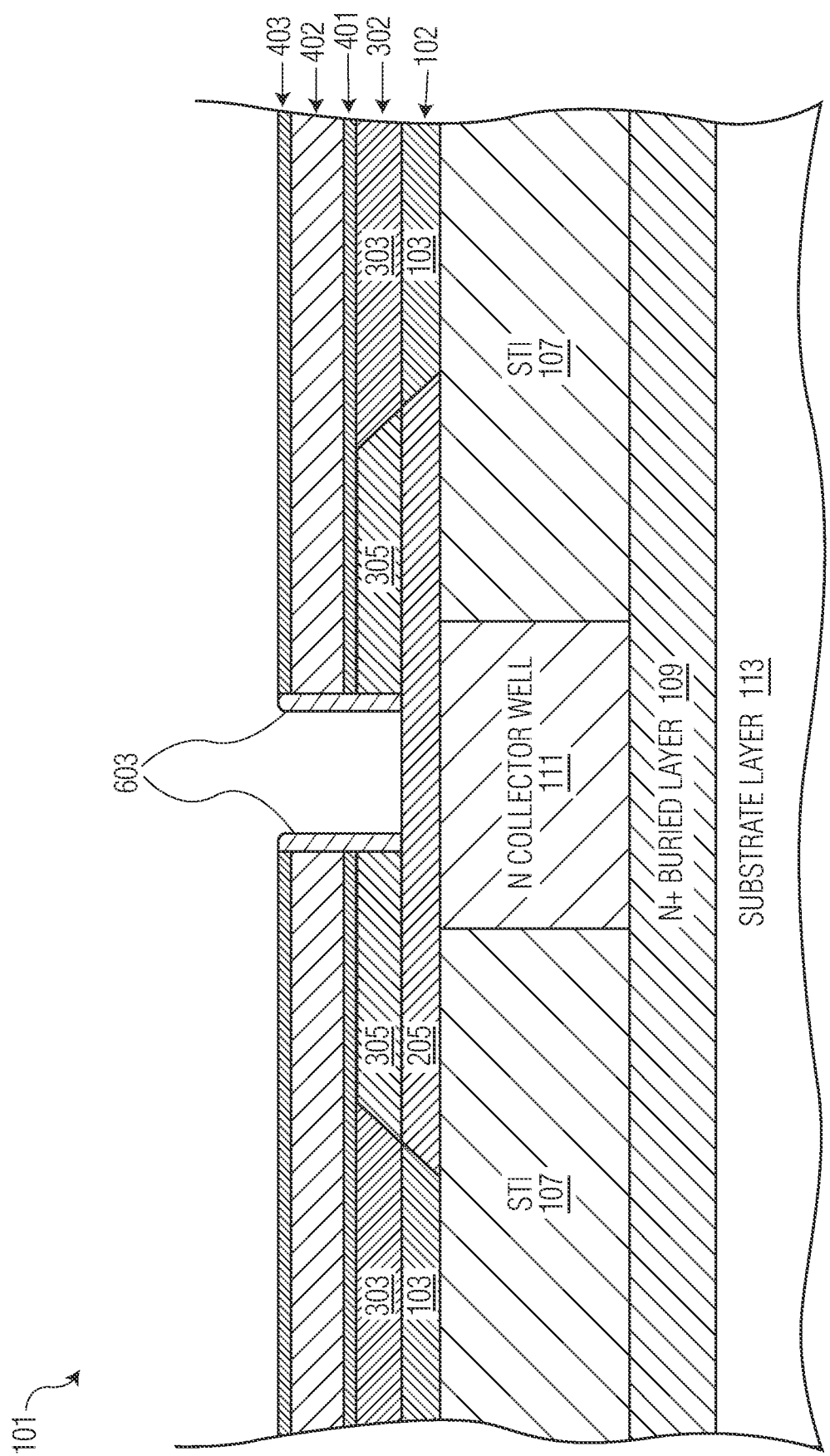

FIG. 6 is a partial cutaway side view of wafer 101 after photo resist layer 501 has been stripped and nitride spacers 603 are formed on the sidewalls of layers 302, 401, 402, and 403. In one embodiment, a layer of nitride is formed on wafer 101 followed by a reactive ion etch of the nitride layer.

Figure 7:
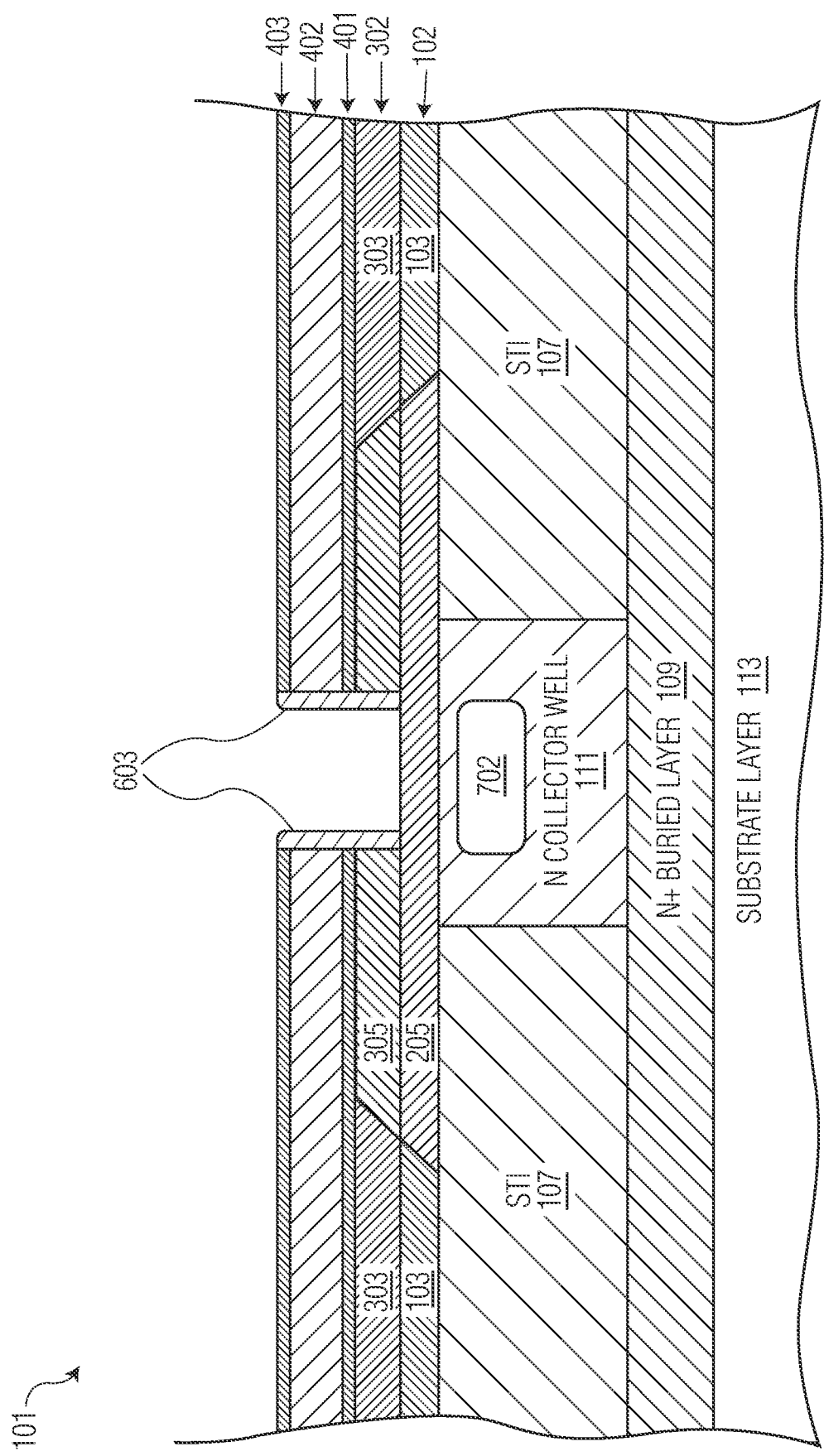

FIG. 7 is a partial cutaway side view of wafer 101 after a selectively implanted collector (SIC) region 702 is formed by an ion implantation of N-type dopants through opening 503. In one embodiment, region 702 is formed by the ion implantation of N-type dopants at a dosage of 2e13~2e14 and at energies in the range of 100~500 keV, but may be formed with other dosages and at other energies in other embodiments. Region 702 serves as a collector region for a subsequently formed transistor.

In some embodiments, region 702 maybe formed at other times during the processing of wafer 101. For example, region 702 may be implanted prior to the formation of layer 102 or at the stage of FIG. 8. However, forming region 702 after the formation of window 503 may advantageously allow for region 702 to be self-aligned with a subsequently formed emitter of the transistor. Also, implanting region 702 through portion 103 may prevent ion implantation surface damage to well 111.

Figure 8:
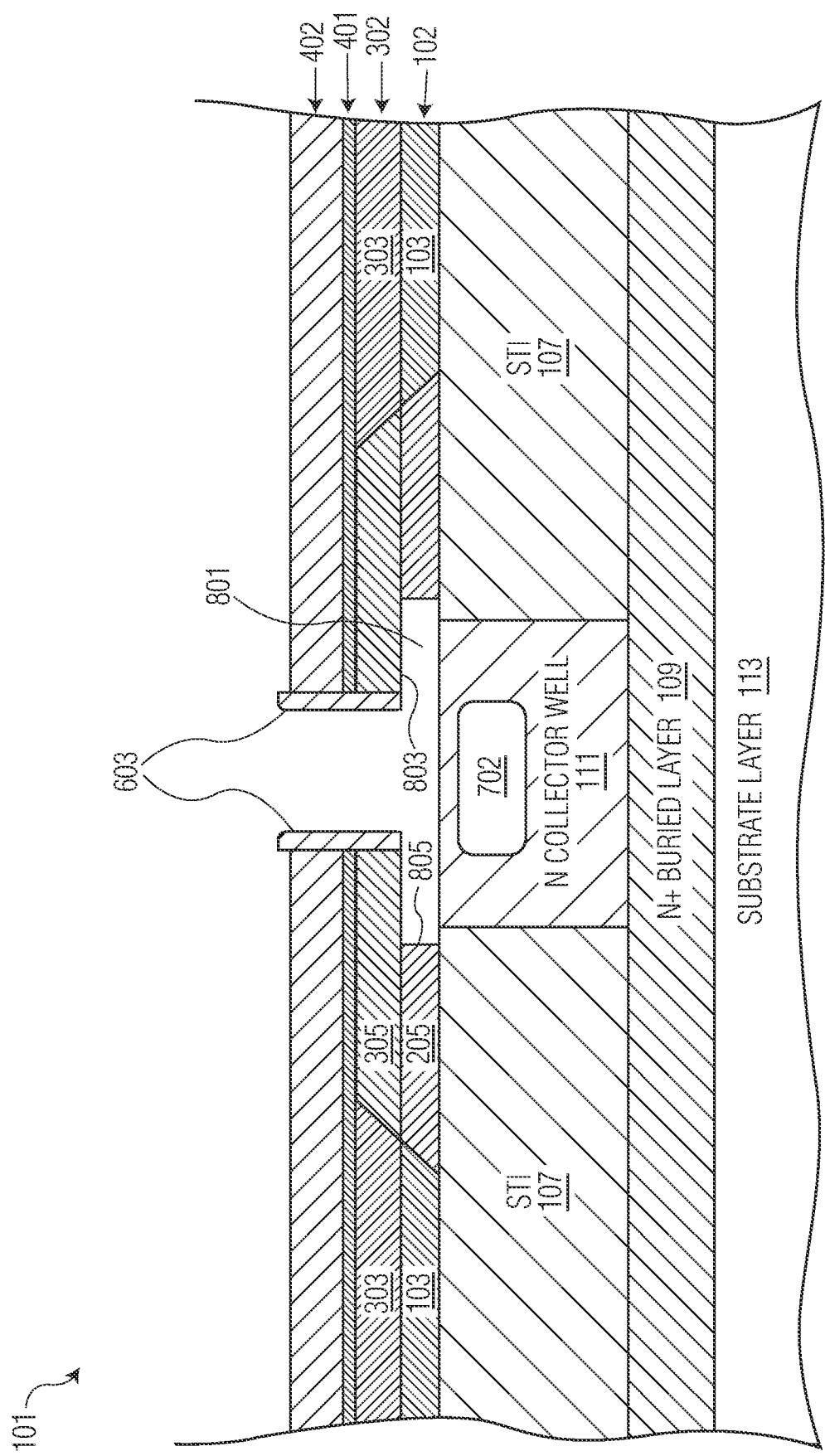

FIG. 8 shows a partial side view of wafer 101 after a portion of monocrystalline portion 205 of layer 102 is removed by an etching process to form cavity 801. Prior to the formation of cavity 801, a short wet etch with HF acid is used to remove oxide layer 403. In one embodiment, portions of portion 205 of layer 102 are removed with a wet etch chemistry that is selective to the silicon of layer 302 and well 111, to the nitride of layer 402 and spacer 603, and to the oxide of STI 107, and is selective with respect to the silicon germanium of layer 102 such that the SiGe material of layer 102 is removed and the material of layers 302 and 402, spacer 603, and STI 107 are relatively unaffected by the timed etch. In one embodiment, the wet etch chemistry used includes $CF_4$ mixed with $O_2$. In the embodiment shown, the etch is timed such that cavity 801 extends laterally out from opening 603 to locations beyond the edge of STI 107. In the embodiment shown, all exposed semiconductor surfaces of cavity 801 (sidewall 805 of portion 205, the underside surface 803 of portion 305, and the top surface of well 111) are monocrystalline.

Figure 9:
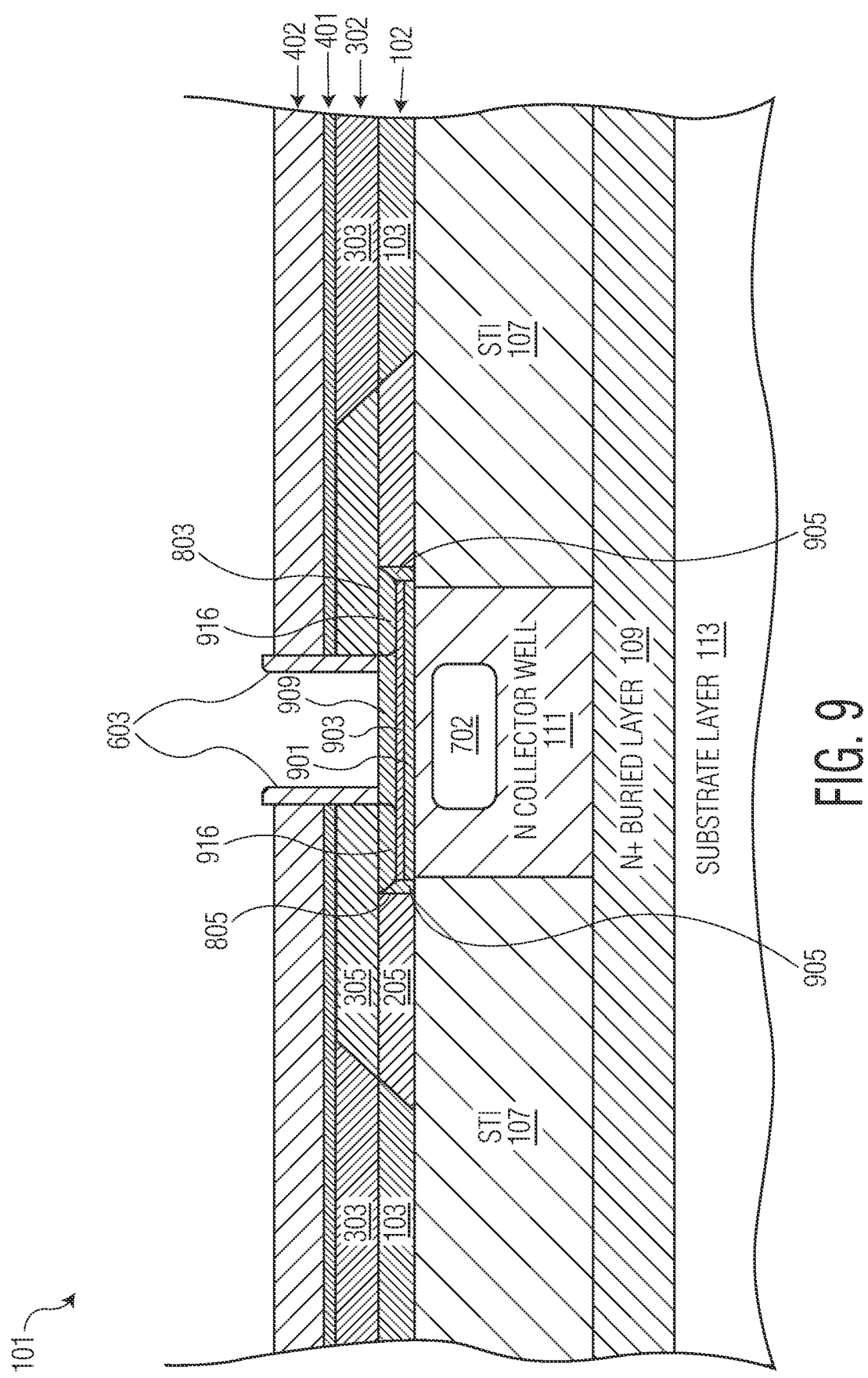

FIG. 9 is a partial cut away side view showing monocrystalline semiconductor material grown by a selective epitaxial process on the exposed semiconductor surfaces of cavity 801. A selective epitaxial process is a process where semiconductor material is only grown on exposed semiconductor material and is not grown on exposed dielectric regions. During the selective epitaxial process, epitaxial silicon is grown on the exposed semiconductor surfaces (the top surface of well 111, the underside 803 of portion 305, and the sidewalls 805 of portion 205) of cavity 801. Because the exposed surfaces of cavity 801 are all monocrystalline, the semiconductor material that is grown by the process is also monocrystalline.

Initially during the selective epitaxial process shown in FIG. 9, a monocrystalline silicon layer 901 is grown on well 111. As the epitaxial process continues, the process conditions are adjusted such that a monocrystalline silicon germanium layer 903 is formed on layer 901. Then process is still further adjusted such that a monocrystalline silicon layer 909 is grown on layer 903. Layers 901, 903, and 909 implement an intrinsic base for a subsequently formed transistor. An intrinsic base is a region of the base that is located directly between the collector-base PN junction and the emitter-base PN junction, whose biasing controls the interaction between the collector and the emitter. The selectively grown monocrystalline semiconductor material of layer 903 is also in-situ doped with P type conductivity dopants.

During the epitaxial growth process, monocrystalline semiconductor material is grown on top surface of N collector well 111, monocrystalline semiconductor material 905 is grown on sidewall 805 and monocrystalline semiconductor material 916 is grown on underside 803 of portion 305.

Figure 10:
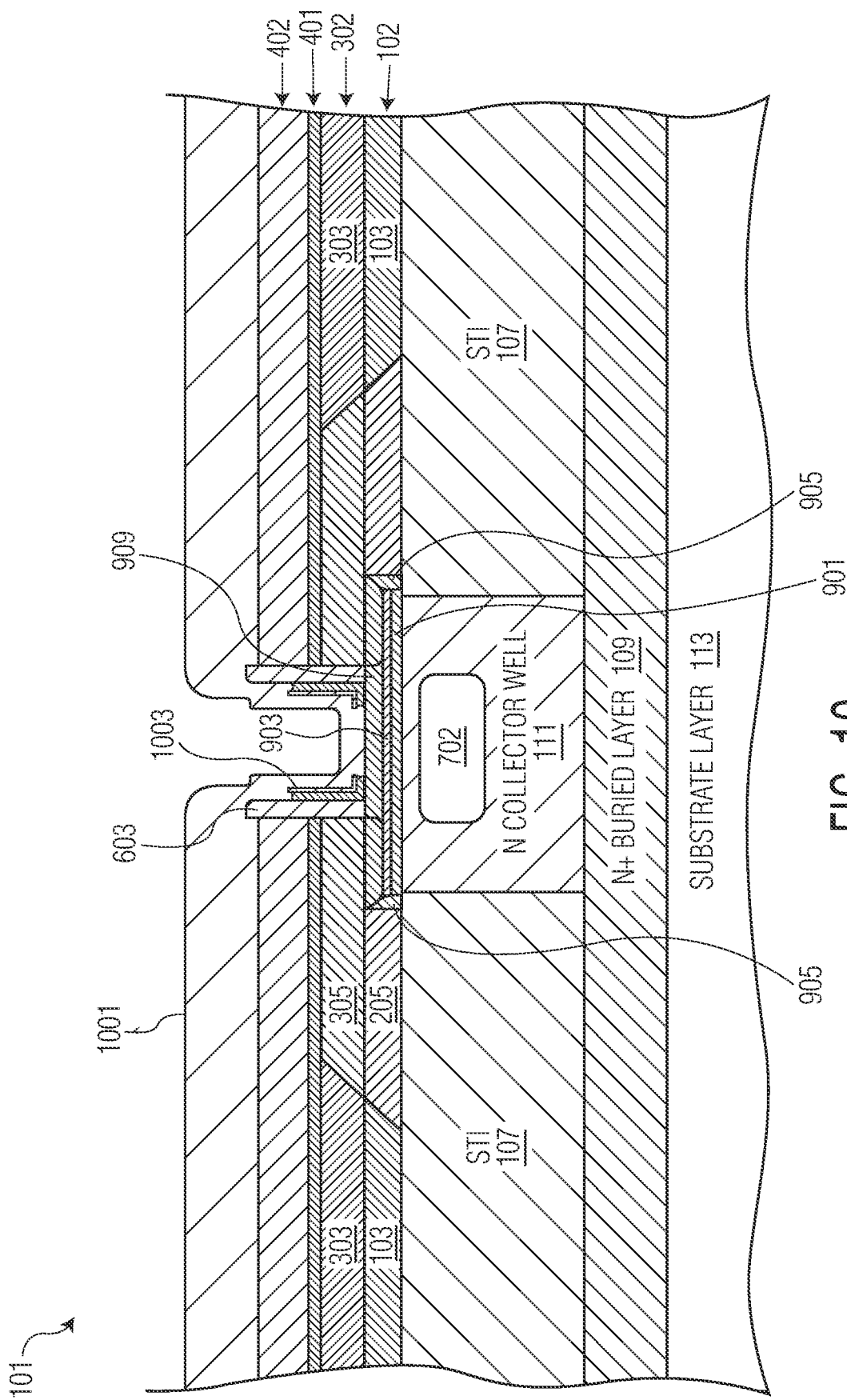

FIG. 10 is a partial cutaway side view of wafer 101 after the formation of an emitter window spacer 1003 and the deposition of a layer 1001 of emitter material.

In one embodiment, spacer 1003 is formed on the inside walls of spacer 603. In the cross-sectional view of FIG. 10, spacer 1003 is shown as two separate portions. However, in some embodiments, spacer 1003 is contiguous around the entire emitter window. The bottom of spacer 1003 further narrows the emitter window to narrow the contact area between the intrinsic base layer 909 and a subsequently formed emitter from layer 1001.

In one embodiment, spacer 1003 is formed by forming an initial thin oxide layer, followed by forming a thin nitride layer, and then followed by forming a subsequent oxide layer. The subsequent oxide layer is anisotropically etch to form an oxide spacer (not shown) that is then used to anisotropically etch the thin nitride layer, which is then used to etch (isotropically, anisotropically, or a by a combination) the initial thin oxide layer. The oxide spacer is removed during subsequent processing (e.g., during an HF acid clean before the emitter material deposition), although it may remain in some embodiments. in other embodiments, a spacer 1003 may be formed by other ways. Some embodiments may not include spacer 1003.

After the formation of spacer 1003, a layer of emitter material (e.g., N-type doped polycrystalline silicon) is formed on wafer 101. In some embodiments, layer 1001 is formed in-situ doped with N-type conductivity dopants, but in other embodiments, layer 1001 may be initially formed undoped and subsequently doped by ion implantation. In one embodiment, the emitter material is grown by a nonselective epitaxial process where N+ doped monocrystalline silicon is grown on base layer 909 and N+ doped polycrystalline silicon is grown on the dielectric surfaces. Prior to the nonselective epitaxial process, wafer 101 is subjected to a cleaning operation with HF acid and a pre-bake in a hydrogen atmosphere. The HF acid and hydrogen pre-bake removes an oxide spacer of spacer 1003 (as described in the previous paragraph) as well a portion of the initial oxide layer of spacer 1003 on base layer 909.

Figure 11:
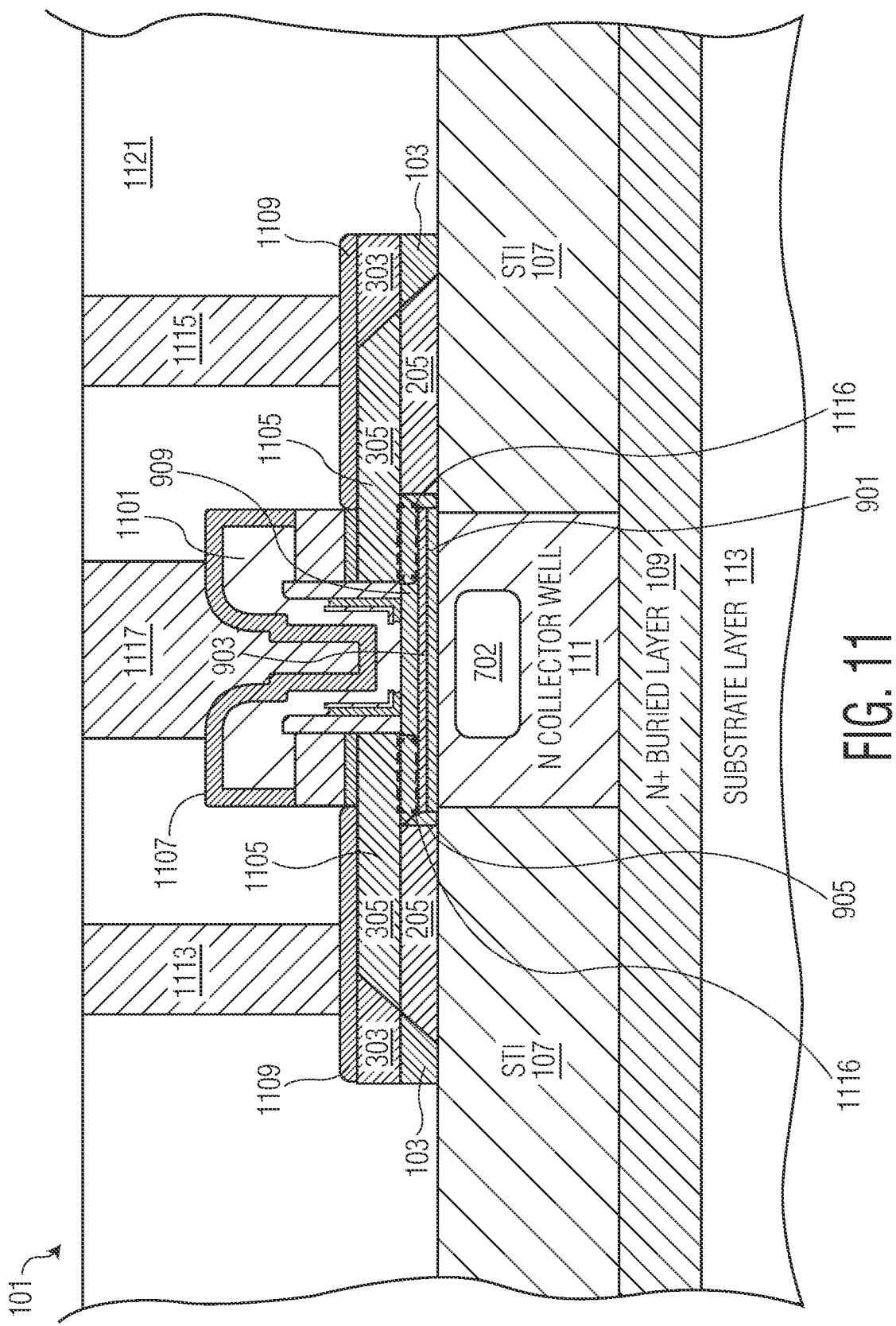

FIG. 11 shows wafer 101 at a subsequent stage in its manufacture. After the stage of FIG. 10, emitter material layer 1001 (along with nitride layer 402 and oxide layer 401) is patterned to form emitter 1101. Next, layer 302 and layer 102) is patterned to form an extrinsic base layer 1105 that includes monocrystalline portion 305 and polycrystalline portion 303. A final emitter/base anneal is then performed to activate the dopants. Afterwards, wafer 101 is subject to a silicidation process where a metal (e.g., cobalt) is deposited on wafer 101 and heated such that a silicide forms on exposed silicon surfaces. For example, silicide structure 1109 is formed on extrinsic base layer 1105 and silicide structure 1107 is formed on emitter 1101.

Afterwards, one or more dielectric layers 1121 are formed on wafer 101 and planarized. Openings are then formed to contact the silicide structures. Contact metal (e.g., tungsten, titanium, titanium nitride) is then formed in the openings where wafer 101 is planarized to form contacts for the electrodes of wafer 101. For example, contacts 1113 and 1115 are formed to contact base silicide structure 1109 and contact 1117 is formed to contact emitter silicide structure 1107.

Accordingly, FIG. 11 shows a cross section of a HBT bipolar transistor with an emitter (emitter 1101). The bipolar transistor includes a base of intrinsic base (layers 901, 903, and 909), extrinsic base layer 1105, and a linking region (shown as dashed boxed 1116) for linking the extrinsic base layer with intrinsic base. The transistor also includes a collector including region 702 located in collector well 111. The contact for the collector is not shown in the cutaway view of FIG. 11.

After the stage of manufacture shown in FIG. 11, subsequent processes may be performed on wafer 101. For example, upper interconnect layers (not shown) may be formed on top of wafer 101 and include conductive structures electrically coupled to the contacts for the collector, emitter, and/or base of the transistor of FIG. 11 as well as to the contacts of other devices formed on wafer 101. Afterwards, wafer 101 is separated into multiple semiconductor dies each with at least one transistor similar to the transistor shown in FIG. 11. The die are protected in semiconductor packages that can be implemented in electronic systems such as e.g., RF communications devices, motor controllers, automotive electronics systems, or cellular phones. In one example, the transistor is used as a power amplifier to amplify a received RF signal or to amplify an RF signal to be transmitted, for example, as used in a cellular telephone.

One advantage that may occur from the use of a semiconductor layer 102 that is used as a seed layer for a subsequently formed extrinsic base layer 302 wherein a portion of layer 102 is removed to form a cavity for the formation of an intrinsic base is that it allows for the extrinsic base layer (302) to include a monocrystalline portion (305) in the area surrounding the emitter window in a transistor where the collector region 702 and the emitter are self-aligned. This method allows for the formation of a monocrystalline portion (305) in the area surrounding the emitter window while maintaining a relatively small width of collector well (111). This may provide for a transistor with a low collector-base capacitance, while having a low base resistance due to a monocrystalline path (including link region 1116 and portion 305) from the intrinsic base to the base silicide structure 1109. Furthermore, removing a portion of seed layer 102 allows for the removal of any surface damage from ion implantation (e.g., from ion implantation of collector region 702) such that it will not affect the quality of the subsequently grown intrinsic base. Also, in some embodiments, utilizing a semiconductor seed layer 102 allows for an expansion of the monocrystalline portion 205 of the seed layer, which allows for an increase the size of the monocrystalline area of portion 305 of the extrinsic base layer. Such a process may allow for a wider link region (1116) which provides for a lower base resistance. Furthermore, in some embodiments, forming a semiconductor seed layer 102 on STI 107 and well 111 instead of a dielectric layer may reduce the number of steps in that the dielectric layer does not have to be separately patterned.

Furthermore, the transistor of FIG. 11 includes a continuous path from the extrinsic base (layers 901, 903, and 909), link region 1116, and portion 305 of the extrinsic base to the base silicide structure 1109 that is of a monocrystalline material. Such a configuration may provide for a lower base resistance.

As mentioned above, providing a wider link region 1116 may provide for a lower base resistance from the intrinsic base to the base silicide structure 1109. However, such a wider link region may increase the base-collector capacitance in some embodiments. Accordingly, it may be desirable to reduce the width of the link region 1116 so as to lower the base-collector capacitance (at a cost in some embodiments of increasing the base resistance).

Figure 12:
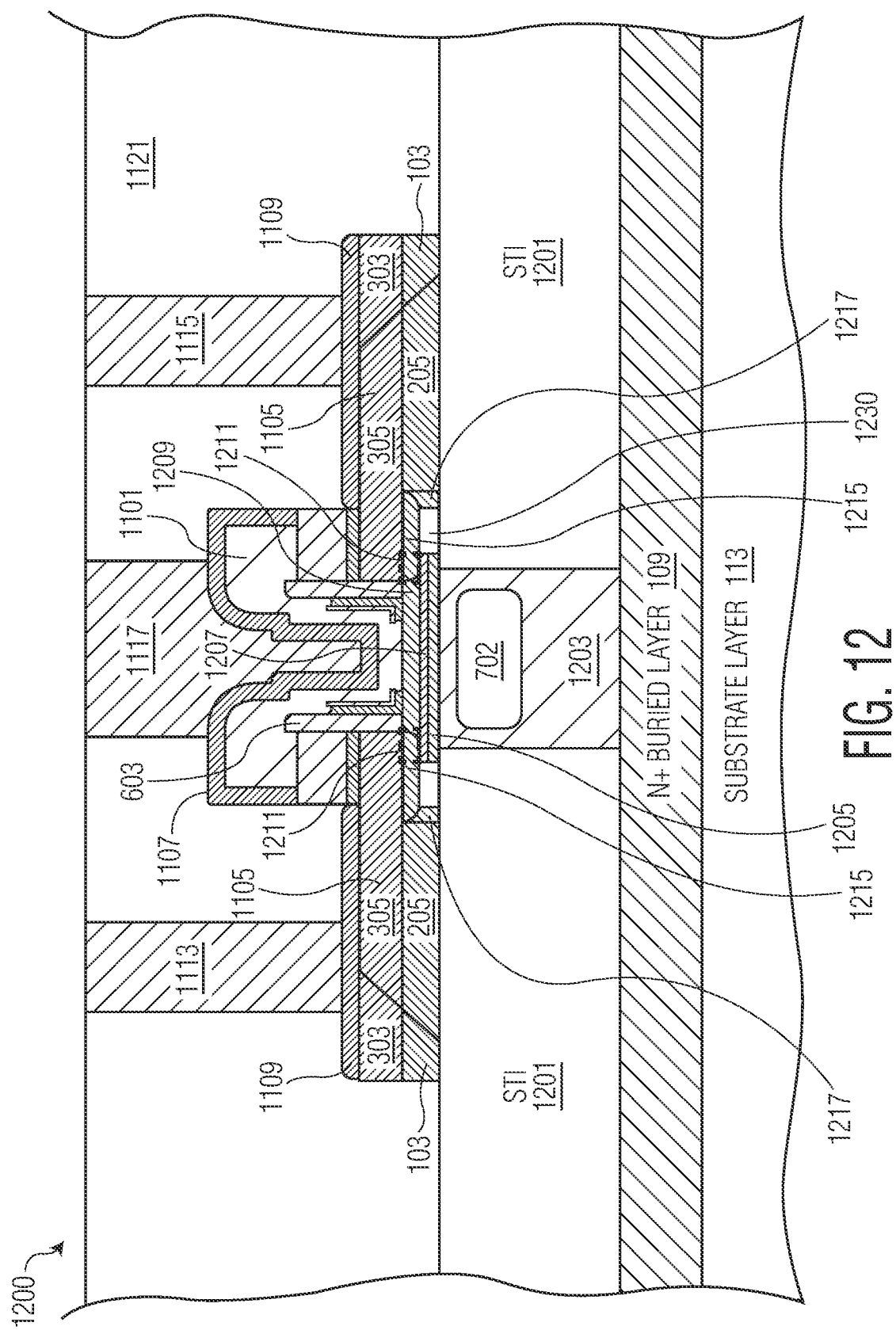
FIG. 12 is a partial cutaway side view of a wafer at a stage in the manufacture of a semiconductor device according to another embodiment of the present invention.

FIG. 12 is a partial cutaway side view of another embodiment of wafer 1201. The items having the same references numbers as the device of FIG. 11 are similar. The transistor of FIG. 12 is different from the transistor of FIG. 11 in that the lateral width of collector well 1203 between the sections of STI structure 1201 shown in FIG. 12 is narrower with respect to the emitter widow width of the embodiment of FIG. 12 than the width of collector well 111 with respect to the emitter widow (503) width of the embodiment of FIG. 11. Consequently, the width of the intrinsic base layers (silicon layer 1205, SiGe layer 1207, and silicon layer 1209) are narrower as is the base link region 1211. Because the base link region 1211 is narrower than the base link region 1116 of the transistor of FIG. 11, the transistor of FIG. 12 has a lower base collector capacitance but a higher base resistance than the transistor of FIG. 11. Alternatively, cavity 801 being wider than N collector well 111 allows for region 1211 to be wider as compared to region 1116, providing for lower base resistance. An air gap 1230 is located laterally between layers 1205, 1207, and 1209 and monocrystalline portion 1217 and below monocrystalline portion 1215. Portions 1217 and 1215 are grown during a selective epitaxial growth process with layers 1205, 1207, and 1209.

The transistors describe herein may have other configurations, have other structures, be made of other materials, and/or may be made by other processes. For example, layers 302 and 102 may be made of other semiconductor materials that are etch selectable from each other. Also, FIGS. 11 and 12 each show an NPN bipolar transistor, however, other types of transistors may be made by the processes described herein. For example, a PNP transistor may be formed where the collector and emitter have a net P-type conductivity doping and the base has a net N-type conductivity doping.

As disclosed herein, a first structure is "directly over" a second structure if the first structure is located over the second structure in a line having a direction that is perpendicular with a generally planar major side of the wafer or substrate. For example, in FIG. 11, silicide structure 1109 is directly over portion 205. Contact 1115 is not directly over region 702. As disclosed herein, a first structure is "directly beneath" or "directly under" a second structure if the first structure is located beneath the second structure in a line having a direction that is perpendicular with a generally planar major side of the wafer or substrate. For example, in FIG. 11, region 702 is directly beneath emitter 1101. Region 702 is not directly beneath contact 1113. One structure is "directly between" two other structures in a line if the two structures are located on opposite sides of the one structure in the line. For example, in FIG. 11, emitter 1101 is located directly between contacts 1113 and 1115 in a line in the cut away side view of FIG. 1. Emitter 1101 is not located directly between the two sections of STI 107 shown in FIG. 11. A first structure is "directly lateral" to a second structure if the first structure and second structure are located in a line having a direction that is parallel with a generally planar major side of the wafer or substrate. For example, emitter 1101 and contact 1115 are directly lateral to each other. One structure is "directly laterally between" two other structures if the two structures are located on opposite sides of the one structure in a line that is parallel with a generally planar major side of the wafer or substrate. For example, in FIG. 11, emitter 1101 is located directly laterally between contacts 1113 and 1115. A surface is at a "higher elevation" than another surface, if that surface is located closer to the top of the active side of a wafer or die in a line having a direction that is perpendicular with the generally planar major side of the wafer or die. In the views of FIGS. 1-12, the active side of the wafer is the top side of the Figures. For example, portion 305 is at a higher elevation than portion 205.

One embodiment includes a method for forming a semiconductor die including a transistor. The method includes, on a wafer including a first semiconductor layer and a second semiconductor layer located on the first semiconductor layer, forming a first opening in the second semiconductor layer at a first area of the wafer to expose the first semiconductor layer. The first semiconductor layer being located directly over a region of monocrystalline semiconductor material in the first area. The method includes, after the forming the first opening, removing a portion of the first semiconductor layer to form a cavity with an etch chemistry that is selective with respect to semiconductor material of the first semiconductor layer in the first area and selective to semiconductor material of the second semiconductor layer in the first area. The removing the portion exposes at least a portion of the region of monocrystalline semiconductor material in the first area and exposes an underside portion of the second semiconductor layer laterally adjacent to the first opening. The method includes selectively growing monocrystalline semiconductor material in the cavity. The selectively grown monocrystalline semiconductor material contacting the region of monocrystalline semiconductor material in the first area and a portion of an underside portion of the second semiconductor layer. The method includes forming an emitter of a transistor. The emitter including at least a portion located in the first area. The method includes separating the wafer into a plurality of die including a first die. The first die includes the transistor. The transistor includes an intrinsic base region located in the selectively grown monocrystalline semiconductor material and a collector including a portion located in the region of monocrystalline semiconductor material in the first area.

In another embodiment, a transistor includes an emitter, a collector, and a base. The base includes an intrinsic base of monocrystalline semiconductor material located directly over a portion of the collector. A portion of the emitter is located directly over the intrinsic base. A first semiconductor layer including polycrystalline semiconductor material is located directly lateral to at least two opposing sides of the intrinsic base. The transistor includes a second semiconductor layer located directly over the first semiconductor layer. The second semiconductor layer includes a first portion characterized as monocrystalline and a second portion characterized as polycrystalline. The second portion being in contact with polycrystalline material of the first semiconductor layer. The transistor includes a base silicide structure located on the second semiconductor layer.

Features specifically shown or described with respect to one embodiment set forth herein may be implemented in other embodiments set forth herein.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for forming a semiconductor die including a transistor, the method comprising:
    on a wafer including a first semiconductor layer and a second semiconductor layer located on the first semiconductor layer, forming a first opening in the second semiconductor layer at a first area of the wafer to expose the first semiconductor layer, the first semiconductor layer being located directly over a region of monocrystalline semiconductor material in the first area;
    after the forming the first opening, removing a portion of the first semiconductor layer to form a cavity with an etch chemistry that is selective with respect to semiconductor material of the first semiconductor layer in the first area and selective to semiconductor material of the second semiconductor layer in the first area, wherein the removing the portion exposes at least a portion of the region of monocrystalline semiconductor material in the first area and exposes an underside portion of the second semiconductor layer laterally adjacent to the first opening;
    selectively growing monocrystalline semiconductor material in the cavity, the selectively grown monocrystalline semiconductor material contacting the region of monocrystalline semiconductor material in the first area and a portion of an underside portion of the second semiconductor layer;
    forming an emitter of a transistor, the emitter including at least a portion located in the first area;
    separating the wafer into a plurality of die including a first die, wherein the first die includes the transistor, the transistor including an intrinsic base region located in the selectively grown monocrystalline semiconductor material and a collector including a portion located in the region of monocrystalline semiconductor material in the first area.

2. The method of claim 1 wherein the portion of the underside portion of the second semiconductor layer includes monocrystalline semiconductor material.

3. The method of claim 1 further comprising:
    forming a silicide structure for a base electrode of the transistor directly over the second semiconductor layer;
    forming a base contact electrically coupled to the silicide structure.

4. The method of claim 3 wherein transistor includes a continuous path of monocrystalline semiconductor material from the region of monocrystalline semiconductor material to the silicide structure of the base electrode.

5. The method of claim 1 further comprising:
    forming the first semiconductor layer on the wafer, wherein the region of monocrystalline semiconductor material is located directly laterally between dielectric material of the wafer, wherein the forming the first semiconductor layer includes forming the first semiconductor layer where a portion of the first semiconductor layer directly over the region is characterized as monocrystalline and a portion of the first semiconductor layer directly over a dielectric material of the wafer is characterized as polycrystalline.

6. The method of claim 5 wherein the forming the first semiconductor layer includes forming the first semiconductor layer by a non selective epitaxial growth process.

7. The method of claim 5 further comprising:
after the forming the first semiconductor layer, converting a first portion of the first semiconductor layer directly over the dielectric material from being characterized as polycrystalline to being characterized as monocrystalline.

8. The method of claim 1 further comprising:
forming the second semiconductor layer on the first semiconductor layer, wherein the forming the second semiconductor layer includes forming the second semiconductor layer where a first portion of the second semiconductor layer directly over the region of monocrystalline semiconductor material is characterized as monocrystalline and a second portion of the second semiconductor layer located directly outward from the first portion of the second semiconductor layer is characterized as polycrystalline, wherein the underside portion is part of the first portion of the second semiconductor layer.

9. The method of claim 8 wherein the region of monocrystalline semiconductor material is located directly laterally between dielectric material of the wafer, wherein the first semiconductor layer includes a first portion that is characterized as monocrystalline and a second portion located directly over dielectric material of the wafer and is characterized as polycrystalline, wherein the first portion of the second semiconductor layer is located directly over the first portion of the first semiconductor layer and the second portion of the second semiconductor layer is located directly over the second portion of the first semiconductor layer.

10. The method of claim 9 wherein a portion of the first portion of the second semiconductor layer is located directly over dielectric material of the wafer.

11. The method of claim 1 wherein an air gap remains in the cavity after the separating.

12. The method of claim 1 wherein at least a portion of the emitter is located in the first opening.

13. The method of claim 1 wherein the emitter is in contact with the selectively grown monocrystalline semiconductor material.

14. The method of claim 1 where in the first semiconductor layer is characterized as a silicon germanium layer and the second semiconductor layer is characterized as a silicon layer.

15. The method of claim 1 wherein the transistor is characterized as a heterojunction bipolar transistor.

16. The method of claim 1 wherein at the start of the selectively growing, all exposed semiconductor surfaces in the cavity are characterized at monocrystalline.

17. A transistor comprising:
an emitter;
a collector;
a base, the base including an intrinsic base of monocrystalline semiconductor material located directly over a portion of the collector, a portion of the emitter is located directly over the intrinsic base;
a first semiconductor layer including polycrystalline semiconductor material located directly lateral to at least two opposing sides of the intrinsic base;
a second semiconductor layer located directly over the first semiconductor layer, the second semiconductor layer including a first portion characterized as monocrystalline and a second portion characterized as polycrystalline, the second portion being in contact with polycrystalline material of the first semiconductor layer;
a base silicide structure located on the second semiconductor layer.

18. The transistor of claim 17 wherein the first semiconductor layer is characterized as a silicon germanium layer.

19. The transistor of claim 17 wherein the transistor is characterized as a heterojunction bipolar transistor.

20. The transistor of claim 17 further comprising:
an air gap located directly laterally between the intrinsic base and the polycrystalline semiconductor material of the first semiconductor layer.

* * * * *